United States Patent [19]
Farrington et al.

[11] Patent Number: 5,991,174
[45] Date of Patent: Nov. 23, 1999

[54] SNUBBER CIRCUIT FOR A RECTIFIER, METHOD OF OPERATION THEREOF AND POWER CONVERTER EMPLOYING THE SAME

[75] Inventors: Richard W. Farrington, Heath, Tex.; William P. Gardiner, Wickes, Ark.

[73] Assignee: Lucent Technologies Inc., Murray Hill, N.J.

[21] Appl. No.: 09/141,783

[22] Filed: Aug. 28, 1998

[51] Int. Cl.⁶ .................................................. H02H 7/122
[52] U.S. Cl. ............................ 363/56; 323/222; 323/225
[58] Field of Search .................................. 363/15, 50, 55, 363/56; 323/222, 225, 232, 282, 299, 351; 361/15, 56, 58, 118

[56] References Cited

U.S. PATENT DOCUMENTS

| | | | |
|---|---|---|---|
| 5,461,302 | 10/1995 | Garcia et al. | 323/222 |
| 5,793,190 | 8/1998 | Sahlstrom et al. | 323/222 |
| 5,841,268 | 11/1998 | Mednik | 323/222 |

OTHER PUBLICATIONS

Guichao Hua, Ching–Shan Leu, and Fred C. Lee; "Novel Zero–Voltage–Transition PWM Converters"; 1992 IEEE; pp. 55–61.

Joel P. Gegner and C. Q. Lee; "Zero–Voltage–Transition Converters Using an Inductor Feedback Technique"; 1994 IEEE, pp. 862–868.

Robert Streit and Daniel Tollik; "High Efficiency Telecom Rectifier Using a Novel Soft–Switched Boost–Based Input Current Shaper"; Nov. 1991 IEEE; pp. 720–726.

Richard Garcia, Rui Liu and Victor Lee; "Optimal Design for Natural Convection–Cooled Rectifiers"; 1996 IEEE; pp. 813–822.

*Primary Examiner*—Y. J. Han

[57] ABSTRACT

In a power converter having an input coupled to a power switch and a rectifier for conducting currents from the input to an output of the power converter, a snubber circuit for, a method of, moderating reverse recovery currents associated with the rectifier and a power converter employing the circuit or the method. In one embodiment, the circuit includes a snubber inductor and snubber capacitor coupled to the rectifier. The circuit further includes a first auxiliary switch that conducts to divert a portion of the currents away from the rectifier through the snubber inductor and snubber capacitor. The circuit still further includes a second auxiliary switch, interposed between the power switch and the first auxiliary switch, that conducts to create a path to discharge the capacitor to the output of the power converter.

20 Claims, 2 Drawing Sheets

SNUBBER CIRCUIT FOR A RECTIFIER, METHOD OF OPERATION THEREOF AND POWER CONVERTER EMPLOYING THE SAME

CROSS-REFERENCE TO RELATED APPLICATION

This application is related to U.S. patent application Ser. No. 09/141,820, Attorney Docket No. FARRINGTON 17-4, entitled "A SWITCH DRIVER FOR A SNUBBER CIRCUIT, METHOD OF OPERATION THEREOF AND POWER CONVERTER EMPLOYING THE SAME," commonly assigned with the present application and filed Aug. 28, 1998.

TECHNICAL FIELD OF THE INVENTION

The present invention is directed, in general, to power supplies and, more specifically, to a snubber circuit for a rectifier, method of operation thereof and power converter employing the same.

BACKGROUND OF THE INVENTION

A power converter is a power processing circuit that converts an input voltage waveform into a specified output voltage waveform. A switched-mode power converter is a frequently employed power converter that converts an input voltage waveform into a specified output voltage waveform. A boost power converter is one example of a switched-mode converter that converts the input voltage to an output voltage that is greater than the input voltage. Typically, the boost power converter is employed in off-line applications wherein power factor correction is required and a stable regulated voltage is desired at the output of the power converter.

A non-isolated boost power converter generally includes an energy storage device (e.g., an inductor) coupled between the input voltage and switching device. The switching device is then coupled to an output rectifier (e.g., a power diode) and an output capacitor. The load is connected in parallel to the capacitor. Again, the output voltage (measured at the load) of the boost power converter is always greater than the input voltage. When the switching device is conducting, the diode is reverse biased thereby isolating the output stage. During this period, the input voltage supplies energy to the inductor. When the switching device is not conducting, the output stage receives the energy stored in the inductor for delivery to the load coupled to the output of the converter.

Analogous to all types of power converters, a boost converter is subject to inefficiencies that impair the overall performance of the power converter. More specifically, the rectifying diode suffers from a reverse recovery condition thereby producing excessive power losses in both the rectifying diode and the switching device and oscillations in both current and voltage therefrom. The effect of the reverse recovery condition is more severe in non-isolated converters, such as the boost power converter. The reverse recovery condition can also detrimentally affect the longevity of the components, especially the rectifying diode and switching device, of the boost power converter. Therefore, efforts to minimize the losses associated with the rectifier and switching device and, more specifically, with the rectifying diode will improve the overall performance of the power converter.

A traditional manner to reduce the losses associated with the rectifying diodes is to introduce a snubber circuit coupled to the rectifying diodes. Snubber circuits are generally employed for various functions including to minimize overcurrents and overvoltages across a device during conduction and non-conduction periods and to shape the device switching waveforms such that the voltage and current associated with the device are not concurrently high. For instance, with respect to rectifying diodes, a snubber circuit may be employed to minimize oscillations in both voltage and current and power losses associated therewith due to reverse recovery currents resulting from a snap-off of the rectifying diode during a transition from a conduction to non-conduction mode of operation.

Snubber circuits are well known in the art. One approach to reduce the reverse recovery currents of the rectifying diode is to employ a snubber circuit that includes an inductor in series with the rectifying diode. This type of snubber circuit attempts to recover the energy stored in the snubber inductor during the reverse recovery period of the rectifying diode for delivery to the output of the converter. While the inductor snubber provides an alternative for reducing the reverse recovery currents of the rectifying diode, there are tradeoffs in the selection of the inductor and auxiliary components of the snubber that detract from the advantages of employing such a snubber circuit.

For medium and high power applications, it may be advantageous to employ a pulse width modulated (PWM) boost converter operating in a continuous conduction mode (CCM). It has been identified, however, that the efficiency and maximum switching frequency of a conventional PWM boost topology is limited by the losses resulting from the reverse recovery currents of the output rectifier. A simple way of minimizing these losses is to limit the rate of change of the current (di/dt) through the output rectifier as it turns off. Different alternatives have been suggested to implement this solution. For cost sensitive applications, a passive snubber (such as the inductor snubber described above) may be used. For applications where higher efficiency is necessary, an active snubber circuit may be employed in the PWM boost converter.

Active snubber circuits generally employ a switch and driving circuitry and energy recovery components. While active snubbers enjoy efficiency improvements over passive snubbers, the efficiencies may still further be improved. This is especially important in view of the more arduous operating conditions for the power converters thereby amplifying the necessity for higher efficiency converters. In many applications, for instance, power supplies are subject to environments having a wide range of temperatures in a convection or conduction cooling environment (i.e., no fans). Therefore, improved converter efficiencies are becoming mandatory to meet difficult conditions thereby further supporting the need for more efficient snubber circuits that temper losses in the converter such as reverse recovery currents from the output rectifier.

Accordingly, what is needed in the art is a circuit that moderates a reverse recovery current of a rectifier that maintains the advantages associated with lossless snubber circuits, but overcomes the deficiencies presently available in the design thereof.

SUMMARY OF THE INVENTION

To address the above-discussed deficiencies of the prior art, the present invention provides, for use with a power converter having an input coupled to a power switch and a rectifier for conducting currents from the input to an output of the power converter, a snubber circuit for, and method of, moderating reverse recovery currents associated with the rectifier and a power converter employing the circuit or the method.

In one embodiment, the circuit includes a snubber inductor and snubber capacitor coupled to the rectifier. The circuit further includes a first auxiliary switch that conducts to divert a portion of the currents away from the rectifier through the snubber inductor and snubber capacitor, preferably, before the power switch transitions to a conducting state. The circuit still further includes a second auxiliary switch, interposed between the power switch and the first auxiliary switch, that conducts to create a path to discharge the capacitor to the output, preferably, at or before the power switch transitions to a nonconducting state.

The present invention introduces a snubber circuit for a rectifier that moderates reverse recovery currents associated therewith. The first auxiliary switch diverts and, ultimately, diminishes forward currents passing through the rectifier to thereby reduce reverse recovery currents associated with the turn-off of the rectifier. The second auxiliary switch provides a path to recover a portion of the energy previously stored in the capacitor to the output of the converter. An advantage associated with the present invention includes the soft switching of the power switch and the first and second auxiliary switches. The switches, therefore, generally transition between conducting and nonconducting states under reduced current or reduced voltage conditions thereby reducing switching losses associated therewith and, ultimately, increasing the overall efficiency of the power converter.

In one embodiment of the present invention, the circuit further includes a diode interposed between the snubber inductor and the snubber capacitor. In a related, but alternative embodiment, the circuit includes a second diode interposed between the snubber inductor and the second auxiliary switch.

In one embodiment of the present invention, the circuit further includes a diode positioned in the path to discharge the capacitor to the output. For reasons that will become more apparent, the diode becomes forward biased to facilitate the discharge of the capacitor to the output of the power converter. Of course, the previously introduced diodes are not necessary for the broad scope of the present invention.

In one embodiment of the present invention, the rectifier includes a power diode. While the rectifier to be illustrated and described is a power diode, it should be clear that other rectifying devices are well within the broad scope of the present invention. For instance, active rectifying devices such as synchronous rectifiers may be employed to advantage in the power converter of the present invention.

In one embodiment of the present invention, the power converter further includes a filter coupled across the output. In an embodiment to illustrated and described, the filter is an output capacitor. The output capacitor filters a DC waveform at the output of the power converter. Those skilled in the art are familiar with such filters.

In one embodiment of the present invention, power converter is a boost converter. Of course, the principles of the present invention are equally applicable to other power converter topologies that suffer from reverse recovery losses associated with a rectifier employed therein.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
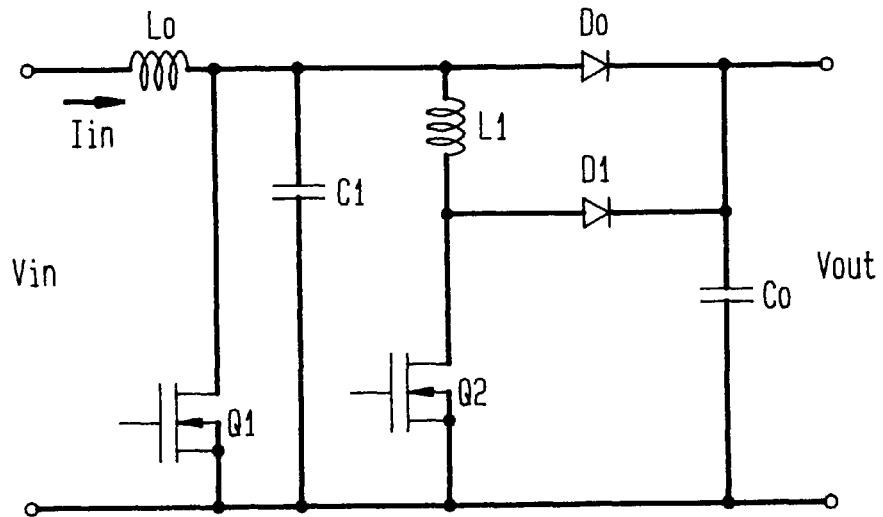
FIG. 1 illustrates a schematic diagram of a conventional PWM boost converter employing an active snubber circuit.

Referring initially to FIG. 1, illustrated is a schematic diagram of a conventional PWM boost converter employing an active snubber circuit. The conventional PWM boost converter includes a power switch Q1, a boost inductor Lo, a boost diode Do, an output capacitor Co and the active snubber circuit which includes an auxiliary switch Q2, a capacitor C1, an inductor L1 and a diode D1.

The power switch Q1 of the PWM boost converter is alternately switched on and off by a PWM signal thereby driving the boost operation for the converter. The boost inductor Lo and the boost diode Do work in concert with this action of the power switch Q1 to provide a DC output voltage Vout which is filtered by the output capacitor Co. The value of the output voltage Vout is maintained by a regulating circuit (not shown) which adjusts the PWM waveform to the power switch Q1 to regulate the output voltage Vout.

The PWM boost converter operates in a continuous conduction mode (CCM) which means that an input current Iin, flowing through the boost inductor Lo, is essentially constant and is alternately routed between the boost diode Do and the power switch Q1. The energy level of the output inductor Lo increases when the power switch Q1 is conducting, and this incremental energy is delivered to the output load through the boost diode Do when the power switch Q1 is not conducting.

The reverse recovery of the boost diode Do is alleviated by the active snubber circuit, which is activated just prior to the power switch Q1 conducting, thereby channeling an increasing portion of the output current through the inductor L1 that was flowing through the boost diode Do. This action eventually routes all of the output current, previously flowing through the boost diode Do, through the inductor L1 and the alternate switch Q2. The boost diode Do thereby turns off "softly", with minimal reverse recovery effects, eliminating the switching losses that would otherwise occur. Furthermore, the voltage across the power switch Q1 reduces to a value of substantially zero before the turn-on of the power switch Q1. However, the active snubber circuit employs the alternate switch Q2 in a "hard" switching mode, which means that it turns-off with a non-zero voltage or current condition, causing high switching losses itself and therefore, reducing the overall efficiency of the boost converter.

Figure 2:
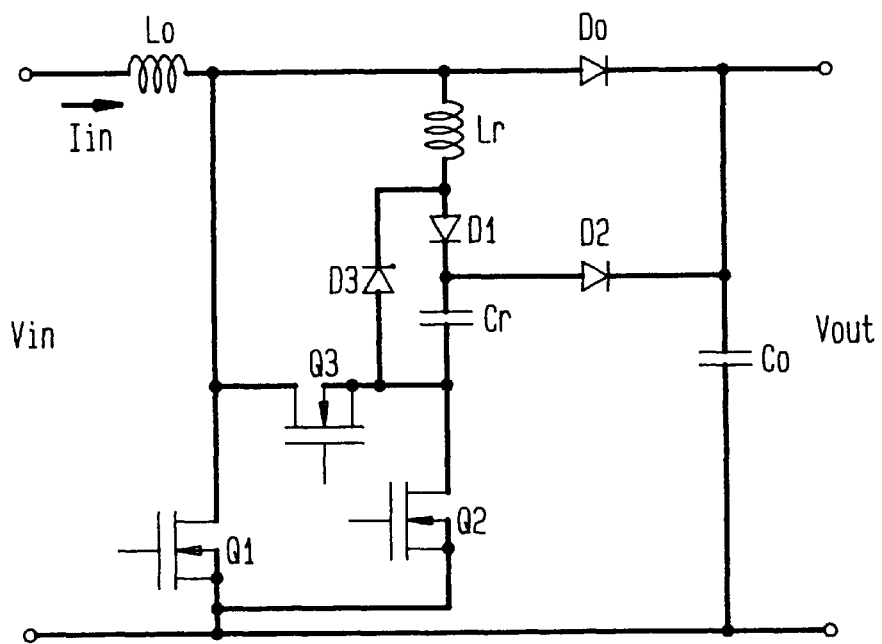
FIG. 2 illustrates a schematic diagram of an embodiment of a three switch (3S) reduced-voltage/zero-current(RV/ZC-transition (T) PWM boost converter constructed according to the principles of the present invention.

Turning now to FIG. 2, illustrated is a schematic diagram of an embodiment of a three switch (3S) reduced-voltage/zero-current(RV/ZC)—transition (T) PWM boost converter constructed according to the principles of the present invention. The 3S RV/ZC-T PWM boost converter, having an input current Iin, includes a power switch Q1, a boost inductor Lo, a rectifier (e.g., a power diode) Do, an output capacitor Co and a snubber circuit which includes first and second auxiliary switches Q2, Q3, a snubber inductor Lr, a snubber capacitor Cr, and first, second and third diodes D1, D2, D3. This embodiment of the present invention provides a power converter having an input coupled to the power switch Q1 and the rectifier Do for conducting currents from the input to an output of the power converter. The snubber circuit, employed in the power converter, provides a method of moderating reverse recovery currents associated with the rectifier Do.

The snubber circuit includes the snubber inductor Lr and the snubber capacitor Cr coupled to the rectifier Do. The snubber circuit further includes the first auxiliary switch Q2 that conducts to divert a portion of the current away from the rectifier Do through the snubber inductor Lr and snubber capacitor Cr before the power switch Q1 transitions to a conducting state. Thus, the first auxiliary switch Q2 diverts and, ultimately, diminishes forward currents passing through the rectifier Do to thereby reduce reverse recovery currents associated with the turn-off of the rectifier Do. Furthermore, it provides The necessary conditions to turn-on the power switch Q1 under substantially zero voltage conditions.

The snubber circuit still further includes a second auxiliary switch Q3, interposed between the power switch Q1 and the first auxiliary switch Q2, that conducts to create a path to discharge the snubber capacitor Cr to the output at or before the power switch Q1 transitions to a nonconducting state. The snubber capacitor Cr also provides a means of resetting the snubber inductor Lr thereby allowing the first auxiliary switch Q2 to turn-off under a substantially zero current condition. Thus, the second auxiliary switch Q3 provides a path to recover a portion of the energy previously stored in the snubber capacitor Cr to the output of the converter. The first and second auxiliary switches Q2, Q3 transition to a conducting state under a reduced voltage or current condition to reduce switching losses associated therewith. This embodiment results in a soft-switching operation of all major semiconductor components while reducing the circulating energy.

The snubber circuit still further includes the first diode D1 interposed between the snubber inductor Lr and the snubber capacitor Cr. The snubber circuit also includes the third diode D3 interposed between the snubber inductor Lr and the second auxiliary switch Q3. Addition of the third diode D3, provides a path to reset the inductor Lr and minimize the interaction of the major parasitic components. Additionally, the second diode D2 is positioned in the path to discharge the snubber capacitor Cr to the output.

While the rectifier Do is a power diode, it should be clear that other rectifying devices are well within the broad scope of the present invention. For instance, active rectifying devices such as synchronous rectifiers may be employed to advantage in the power converter of the present invention. The power converter further includes a filter coupled across the output in the form of the output capacitor Co. The output capacitor Co filters a DC waveform at the output of the power converter.

The output capacitance of the power switch Q1, the snubber capacitor Cr and the snubber inductor Lr form a resonant, tank (tuned) circuit that provides zero voltage switching (ZVS) to the power switch Q1. A main enhancement of this embodiment is that the first and second auxiliary switches Q2, Q3 turn on and turn off under soft conditions. The first auxiliary switch Q2 turns off under zero current (ZC) conditions and the second auxiliary switch Q3 turns on and turns off under zero voltage (ZV) conditions. Furthermore, the snubber capacitor Cr appears in parallel with the power switch Q1 during its turn-off avoiding the requirement to add any external capacitance across it to slow down its turn-off.

The turn-on of the first auxiliary switch Q2 defines the end of the "off time" of the power stage (the power switch Q1 off). Due to the presence of the snubber capacitor Cr and the first diode D1, the first auxiliary switch Q2 stops conducting naturally and remains in the off state until the power switch Q1 turns-off. Therefore, the first auxiliary switch Q2 can be turned off at any time during this interval as long as the first auxiliary switch Q2 turn-off occurs prior to the power switch Q1 turn-off. The second auxiliary switch Q3 preferably is turned on before the power switch Q1 turns off and should be turned off before the first auxiliary switch Q2 turns on (as will be shown in FIG. 3).

Figure 3:
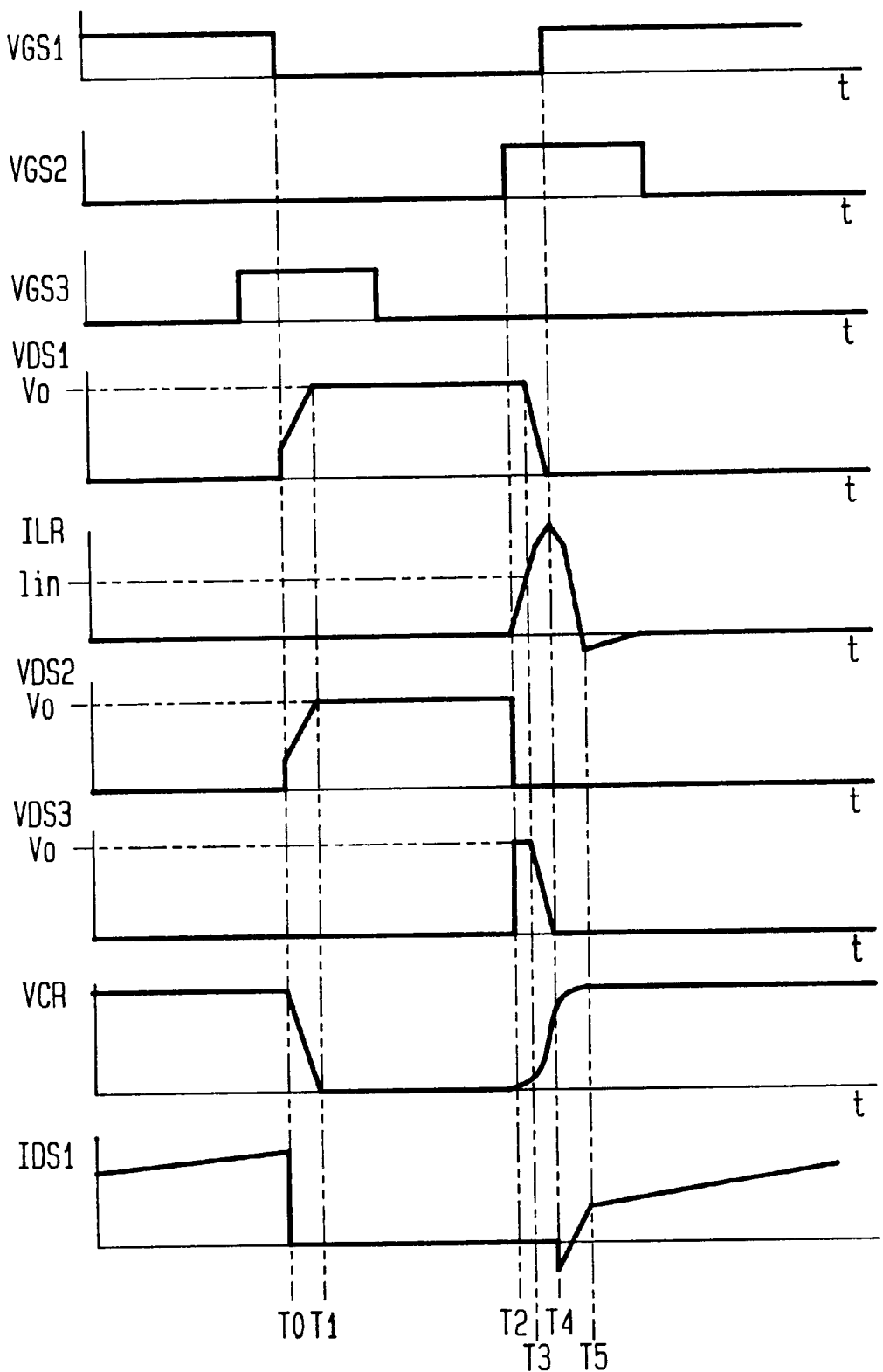
FIG. 3 illustrates a diagram of current and voltage waveforms of the boost converter of FIG. 2.

Turning now to FIG. 3, illustrated is a diagram of current and voltage waveforms of the 3S RV/ZC-T PWM boost converter of FIG. 2. The timing sequence starts during the "off-time" of the power stage, showing the power switch Q1 conducting with a gate-to-source voltage VGS1 positive and a drain-to-source voltage VDS1 essentially zero. The drain-to-source current IDS1 of the power switch Q1, which is also the input current Iin through the boost inductor Lo, is shown to be positive and increasing with time. Additionally, the first auxiliary switch Q2 is not conducting with a gate-to-source voltage VGS2 that is zero and a drain-to-source voltage VDS2 also shown to be zero. The second auxiliary switch Q3 is also not conducting with a gate-to-source voltage VGS3 at zero and a drain-to-source voltage VDS3 shown to be zero. The voltage VCR across the snubber capacitor Cr is at its maximum value, and the current ILR through the snubber inductor Lr is seen to be zero. The gate-to-source voltage VDG3 moves from zero to a positive value thereby placing the second auxiliary switch Q3 in a conducting mode prior to a time T0 as shown. This action allows the second auxiliary switch Q3 to turn on under both a ZV and ZC condition and couples the drains of the power switch Q1 and the first auxiliary switch Q2 together.

At the time T0, the gate-to-source voltage VGS1 moves to zero causing the power switch Q1 to become nonconducting. This action defines the start of the "on-time" of the power stage. The input current Iin is now initially diverted through the second auxiliary switch Q3 since it is conducting, and begins discharging the snubber capacitor Cr as the input current Iin flows through it and the second diode D2 to the boost converter output. When the voltage across the snubber capacitor Cr discharges to zero, the input current Iin is commutated to the rectifier Do. At this point, all of the input current Iin is flowing through the rectifier Do to the boost converter output. This action also causes both the drain-to-source voltages VDS1, VDS2 to rise to the value of the output voltage Vo when the discharge of the snubber capacitor Cr is complete at a time T1, as shown. After the time T1, the second auxiliary switch Q3 becomes nonconducting as the gate-to-source voltage VGS3 moves to zero allowing the second auxiliary switch Q3 to turn off under a ZV and ZC condition.

At a time T2, The first auxiliary switch Q2 starts conducting as the gate-to-source voltage VGS2 becomes positive. This action defines the end of the on-time of the power stage, and causes the input current Iin to begin diverting into the snubber inductor Lr, the first diode D1, the snubber capacitor Cr and the first auxiliary switch Q2. As the current increases through the snubber inductor Lr from an initial value of zero, it reaches a value of the input current Iin at a time T3, as shown. At this point, the current flowing through the rectifier Do becomes zero and it stops conducting allowing for a soft turn off of the rectifier Do without reverse recovery effects. Additionally, at the time T2, the drain-to-source voltage VDS3 moves from zero voltage to the output voltage Vo since the first auxiliary switch Q2 starts conducting, and the voltage VCR begins to increase as the snubber capacitor Cr charges.

At the time T3, the current ILR through the snubber inductor Lr has increased to a value of the input voltage Iin, as stated earlier, and continues to increase. The additional current is contributed from the output capacitance of the power switch Q1 since it is now isolated from both the input and the output of the boost converter. This action causes the drain-to-source voltage VDS1 to decrease to zero. As the drain-to-source voltage VDS1 becomes zero, the power switch Q1 actually becomes conducting before the gate-to-source voltage VGS1 goes positive allowing it to turn on in a ZV condition. At a time T4, the gate-to-source voltage VGS1 becomes positive and the power switch Q1 begins to divert current through itself. The drain-to-source current IDS1 goes initially negative and then ramps up as the snubber capacitor Cr charges and the current ILR through the snubber inductor Lr diminishes. At a time T5, the snubber capacitor Cr is fully charged and the drain-to-source current IDS1 assumes the value of the input current Iin, completing the cycle.

Of course, those skilled in the art should understand that the previously described embodiments of the snubber circuit (and converter topologies and power supplies employed therewith) are submitted for illustrative purposes only, and other embodiments capable of reducing a reverse recovery current of a rectifier and other converter topologies are well within the broad scope of the present invention. For a better understanding of power electronics, power converter topologies, such as the boost power converter, and snubber circuits see *Principles of Power Electronics*, by J. Kassakian, M. Schlecht, Addison-Wesley Publishing Company (1991), *High Efficiency Telecom Rectifier Using a Novel Soft-Switching Boost-Based Input Current Shaper*, by R. Streit, D. Tollik, IEEE Intelec Conference Records, pages 720–726 (1991), *Novel Zero-Voltage-Transition PWM Converters*, by G. Hua, C. S. Leu, F. C. Lee, IEEE Power Electronics Specialists Intelec Conference Records, pages 55–61 (1992), *Soft Transitions Power Factor Correction Circuit*, by I. D. Jitaru, In the Proceedings of HFPC, pages 202–208 (1993), U.S. Pat. No. 5,313,382, entitled Reduced Voltage/Zero Current Transition Boost Power Converter, by R. Farrington, issued May 17, 1994 and commonly assigned with the present invention. The aforementioned references are herein incorporated by reference.

Although the present invention has been described in detail, those skilled in the art should understand that they can make various changes, substitutions and alterations herein without departing from the spirit and scope of the invention in its a broadest form.

What is claimed is:

1. In a power converter having an input coupled to a power switch and a rectifier for conducting currents from said input to an output of said power converter, a snubber circuit, comprising:

a snubber inductor and a snubber capacitor coupled to said rectifier;

a first auxiliary switch that conducts to divert a portion of said currents away from said rectifier through said snubber inductor and said snubber capacitor; and a second auxiliary switch, interposed between said power switch and said first auxiliary switch, that conducts to create a path to discharge said snubber capacitor to said output of said power converter.

2. The circuit as recited in claim 1 further comprising a diode interposed between said snubber inductor and said snubber capacitor.

3. The circuit as recited in claim 1 further comprising a diode interposed between said snubber inductor and said second auxiliary switch.

4. The circuit as recited in claim 1 further comprising a diode positioned in said path to discharge said capacitor to said output.

5. The circuit as recited in claim 1 wherein said rectifier comprises a power diode.

6. The circuit as recited in claim 1 further comprising a filter coupled across said output.

7. The circuit as recited in claim 1 wherein said power converter is a boost converter.

8. In a power converter having an input coupled to a power switch and a rectifier for conducting currents from said input to an output of said power converter, a method of moderating reverse recovery currents associated with said rectifier, comprising:

coupling a snubber inductor and a snubber capacitor to said rectifier;

inducing a first auxiliary switch to conduct to divert a portion of said currents away from said rectifier through said snubber inductor and said snubber capacitor; and inducing a second auxiliary switch, interposed between said power switch and said first auxiliary switch, to conduct to create a path to discharge said snubber capacitor to said output of said power converter.

9. The method as recited in claim 8 further comprising coupling a diode interposed between said snubber inductor and said snubber capacitor.

10. The method as recited in claim 8 further comprising coupling a diode interposed between said snubber inductor and said second auxiliary switch.

11. The method as recited in claim 8 further comprising positioning a diode in said path to discharge said capacitor to said output.

12. The method as recited in claim 8 wherein said rectifier comprises a power diode.

13. The method as recited in claim 8 further comprising filtering an output voltage at said output.

14. The method as recited in claim 8 wherein said power converter is a boost converter.

15. A power converter, comprising:

an input coupled to an input inductor;

a power switch, coupled to said input inductor, that impresses currents through said power converter;

a rectifier for conducting said currents from said input to an output of said power converter; and a snubber circuit, comprising:

a snubber inductor and a snubber capacitor coupled to said rectifier;

a first auxiliary switch that conducts to divert a portion of said currents away from said rectifier through said snubber inductor and said snubber capacitor; and a second auxiliary switch, interposed between said power switch and said first auxiliary switch, that conducts to create a path to discharge said snubber capacitor to said output of said power converter.

16. The power converter as recited in claim 15 wherein said snubber circuit further comprises a diode interposed between said snubber inductor and said snubber capacitor.

17. The power converter as recited in claim 15 wherein said snubber circuit further comprises a diode interposed between said snubber inductor and said second auxiliary switch.

18. The power converter as recited in claim 15 wherein said snubber circuit further comprises a diode positioned in said path to discharge said capacitor to said output.

19. The power converter as recited in claim 15 wherein said rectifier comprises a power diode.

20. The power converter as recited in claim 15 further comprising a filter coupled across said output.

* * * * *